(12) United States Patent
Sato et al.

(10) Patent No.: US 9,260,795 B2
(45) Date of Patent: Feb. 16, 2016

(54) CLOSURE FOR SILICA GLASS CRUCIBLE, SILICA GLASS CRUCIBLE AND METHOD OF HANDLING THE SAME

(75) Inventors: Masaru Sato, Akita (JP); Masami Ohara, Akita (JP)

(73) Assignee: JAPAN SUPER QUARTZ CORPORATION, Akita-shi (JP)

( * ) Notice: Subject to any disclaimer, the term of this patent is extended or adjusted under 35 U.S.C. 154(b) by 694 days.

(21) Appl. No.: 13/617,335

(22) Filed: Sep. 14, 2012

(65) Prior Publication Data

US 2013/0014474 A1　Jan. 17, 2013

Related U.S. Application Data

(62) Division of application No. 12/718,829, filed on Mar. 5, 2010, now abandoned.

(30) Foreign Application Priority Data

Mar. 9, 2009　(JP) .................................. 2009-54432

(51) Int. Cl.
　　*C30B 15/00*　　(2006.01)
　　*C30B 15/10*　　(2006.01)
　　*C30B 11/00*　　(2006.01)
　　*C30B 35/00*　　(2006.01)

(52) U.S. Cl.
　　CPC .............. *C30B 15/10* (2013.01); *C30B 11/002* (2013.01); *C30B 35/002* (2013.01); *Y10T 117/1032* (2015.01)

(58) Field of Classification Search
　　CPC ................................ C30B 15/00; C30B 15/10
　　See application file for complete search history.

(56) References Cited

U.S. PATENT DOCUMENTS

| 1,455,894 | A | 5/1923 | Stockton |
| 2,551,937 | A | 5/1951 | Gallagher |
| 2,812,231 | A | 11/1957 | Zar |
| 2,848,130 | A | 8/1958 | Jesnig |
| 3,712,498 | A | 1/1973 | Lawrence |
| 3,760,969 | A | 9/1973 | Shimamoto |
| 3,957,678 | A | 5/1976 | Dikhoff |
| 4,635,807 | A | 1/1987 | Knapp |
| 5,167,759 | A | 12/1992 | Omino |

FOREIGN PATENT DOCUMENTS

| FR | 1029591 | A | 6/1953 |
| JP | 07-172975 | A | 7/1995 |
| JP | 08-245230 | A | 9/1996 |
| JP | 09-067188 | A | 3/1997 |

(Continued)

OTHER PUBLICATIONS

Chinese Office Action mailed Mar. 27, 2012, issued in corresponding Chinese Patent Application No. 201010129009.4, 12 pages.

(Continued)

*Primary Examiner* — Robert M Kunemund
(74) *Attorney, Agent, or Firm* — Christensen O'Connor Johnson Kindness PLLC

(57) ABSTRACT

A closure for silica glass crucible to be mounted on an opening portion of a silica glass crucible is provided with a peripheral edge mounting portion closely adhered to an inner peripheral end of the opening portion.

5 Claims, 5 Drawing Sheets

(56) References Cited

FOREIGN PATENT DOCUMENTS

| JP | 2000-169282 A | 6/2000 |
| JP | 2000-219207 A | 8/2000 |

OTHER PUBLICATIONS

Extended European Search Report mailed Jun. 7, 2010, issued in corresponding Application No. EP 10155577, 5 pages.
Japanese Office Action mailed Mar. 28, 2012, issued in corresponding Japanese Patent Application No. 2009-054432, 6 pages.

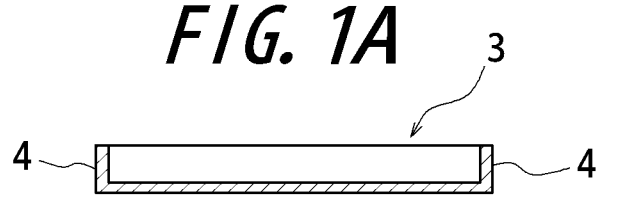
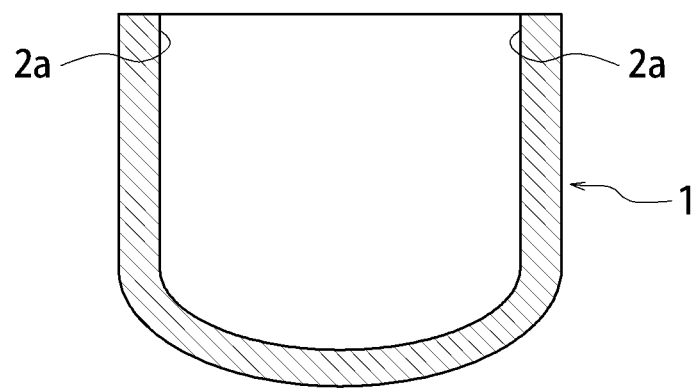
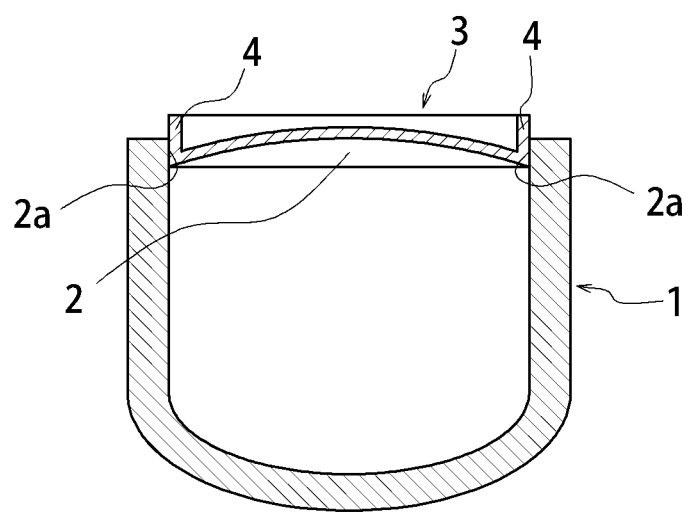

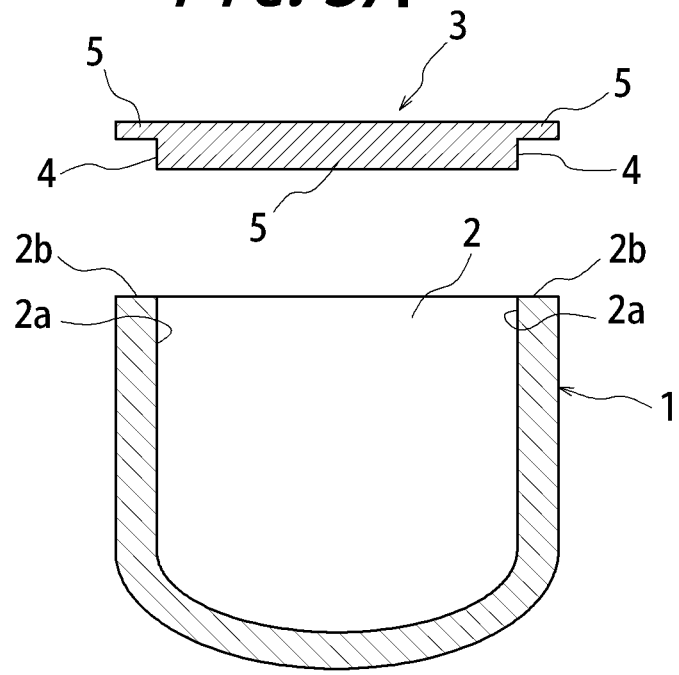
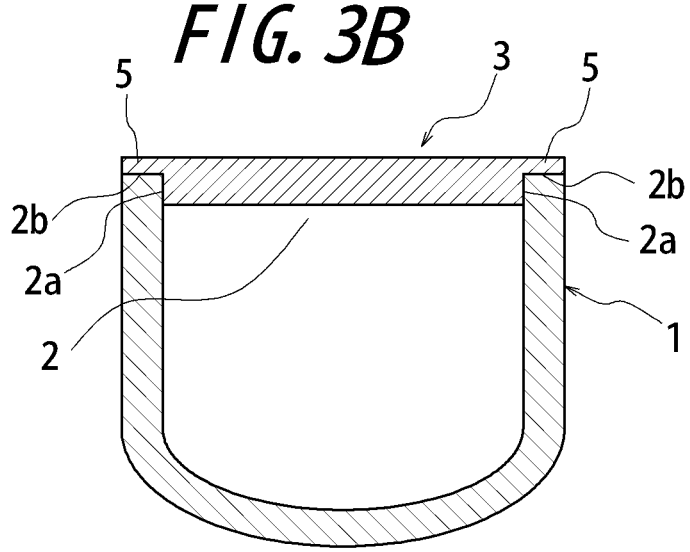

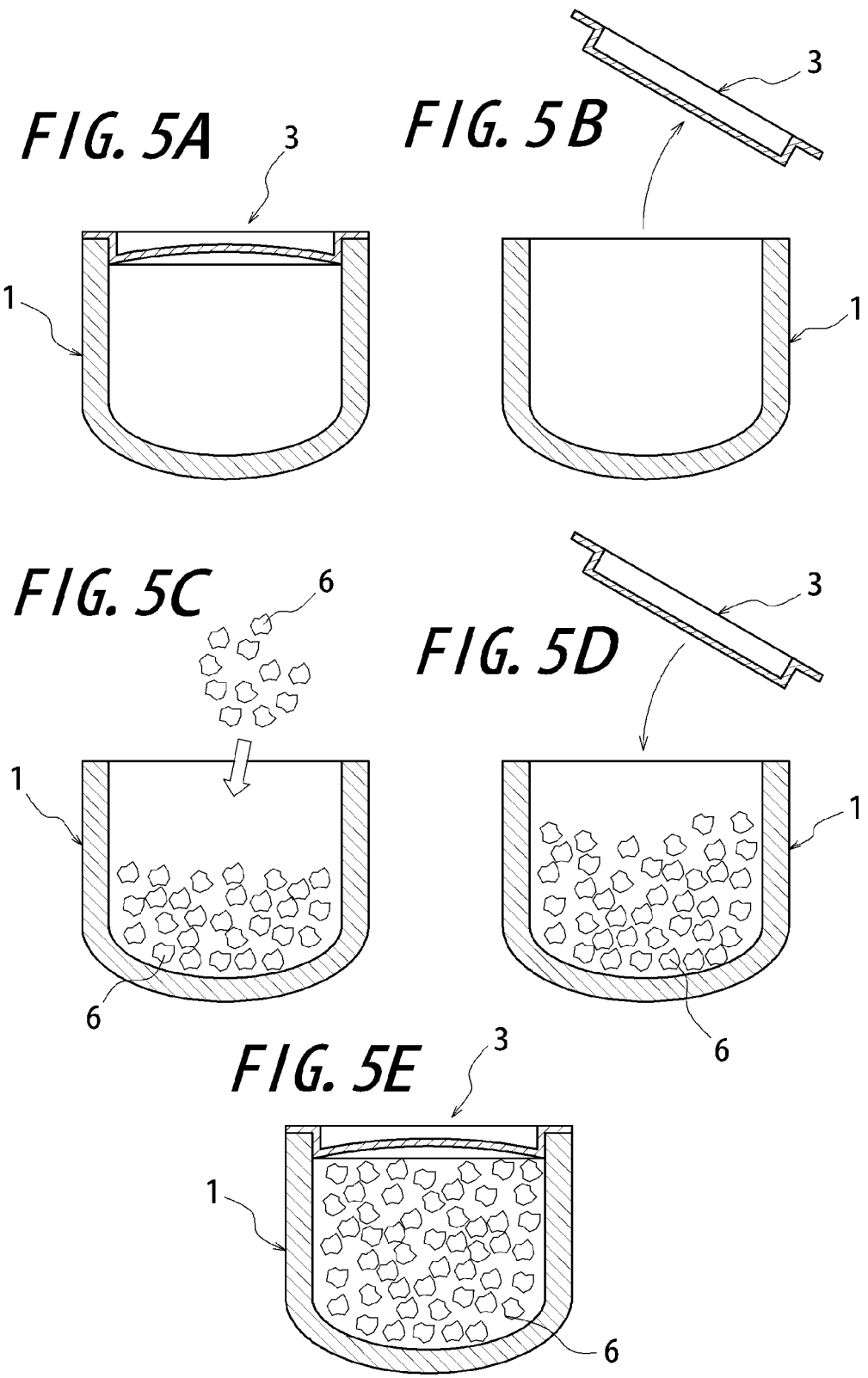

CLOSURE FOR SILICA GLASS CRUCIBLE, SILICA GLASS CRUCIBLE AND METHOD OF HANDLING THE SAME

CROSS-REFERENCES TO RELATED APPLICATIONS

This application is a division of U.S. application Ser. No. 12/718,829, filed on Mar. 5, 2010 now abandoned, which claims benefit from Japanese Application No. 2009-54432, filed Mar. 9, 2009. The disclosure of each application is incorporated herein by reference in its entirety.

BACKGROUND

1. Field of the Invention

This invention relates to a silica glass crucible, especially a silica glass crucible used in a pulling step for the production of a single crystalline silicon, and particularly provides a structure of avoiding intrusion of foreign matter into an inner face of the manufactured silica glass crucible during storing or conveying of the crucible.

2. Description of the Related Art

In the production of single crystalline silicon, it is common that a silica glass crucible used in the melting of polycrystalline silicon as a starting material is cleaned and inspected after the manufacture, and consequently an acceptable product is packed for delivery. With the increase in the purity of semiconductor materials, it is important to suppress various contaminations during the production of single crystalline silicon, and it is also desired to control contamination of a silica glass crucible to minimum. Concretely, when the silica glass crucible is used for pulling a single crystal, it is taken meticulous care on the contamination by cleaning the inside of the crucible with ultra pure water or the like prior to the use. Therefore, it is first important to prevent the manufactured crucible from contamination even in a period from delivery to use. Especially in recent years, the size of the silica glass crucible tends to be gradually increased for enhancing the production efficiency of single crystalline silicon, and hence it is not easy to handle such a larger-size crucible. For example, such a crucible is apt to be easily contaminated during operation such as inspection or packing after the manufacture.

In order to solve such a problem, it is desired to mechanically pack the silica glass crucible at a cleaned state after the cleaning of the silica glass crucible, and hence an apparatus of automatically wrapping the silica glass crucible at the cleaned state is disclosed in JP-A-2000-219207.

Although it becomes particularly possible to avoid contamination at delivery by wrapping with the apparatus described in the above patent document to store the silica glass crucible at the cleaned state, contamination on the inner face of the crucible is not yet prevented completely.

Onto the outer peripheral face of the silica glass crucible is attached silica starting powder and/or silica pieces (hereinafter referred to as raw material powder) of half-molten state, so that such a raw material powder is easily intruded into the inside of the crucible even after wrapping. The raw material powder may be moved inwardly from a gap between a wrapping sheet and an end face of the crucible and intruded into the inside of the crucible, for example, during conveying of the crucible under a wrapping environment, and further when the wrapping sheet is removed after delivery, the raw material powder remaining on the outer face of an opening portion of the crucible may be still intruded into the inside of the crucible, which could not be avoided. In particular, since the conventional wrapping sheet is a thin vinyl sheet, the raw material powder is generated by rubbing the crucible with the vinyl sheet and thereafter intruded easily into the inner face of the crucible through the gap between the sheet and the end face of the crucible.

Moreover, the crucible may be handled at a state of removing the wrapping sheet, for example, after the delivery to a maker for the production of single crystalline silicon. In this case, there is no means for avoiding the intrusion of foreign matters into the inner face of the crucible. In particular, melting treatment does not necessarily start immediately after polycrystalline silicon as a starting material is charged into the crucible and also the crucible is often stored and held at a state of charging the polycrystalline silicon, during which foreign matters are intruded into the crucible to constitute a factor of obstructing single crystallization in the production of single crystalline silicon.

As mentioned above, there are many opportunities of contaminating the inner face of the silica glass crucible, so that it is desired to provide a way for avoiding such contaminations.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

It is, therefore, an object of the invention to provide a way of avoiding the intrusion of the aforementioned raw material powder for crucible in the inner face of the crucible to thereby surely avoid the intrusion of foreign matters into the silica glass crucible until the time of actually using the crucible and to enable the handling of the crucible at a state of not being contaminated.

The summary and construction of the invention are as follows.

(1) A closure for silica glass crucible to be mounted on an opening portion of a silica glass crucible, which is provided with a peripheral edge mounting portion closely adhered to an inner peripheral end of the opening portion.

(2) The closure for silica glass crucible according to the item (1), wherein an amount of metal components at least adhered to an inner face of the closure is not more than 0.05 $ng/cm^2$.

(3) The closure for silica glass crucible according to the item (1), which further comprises a flange portion extending outward from the peripheral edge mounting portion in a radial direction.

(4) The closure for silica glass crucible according to the item (1), which has a flexibility.

(5) The closure for silica glass crucible according to the item (1), which comprises an identifier.

(6) The closure for silica glass crucible according to the item (1), wherein at least a part of the closure is transparent.

(7) A silica glass crucible having a disc-shaped closure in its opening portion, wherein a peripheral edge portion of the closure is closely adhered to an inner peripheral end of the opening portion to fix the closure.

(8) A silica glass crucible having a disc-shaped closure in its opening portion, wherein a peripheral edge portion of the closure is closely adhered to an inner peripheral end of the opening portion and also a flange portion extending outward from a peripheral edge mounting portion in a radial direction is closely adhered to an upper peripheral end face of the opening portion to fix the closure.

(9) A method of handling a silica glass crucible, wherein a closure as described in any one of the items (1) to (6) is mounted onto an opening portion of a silica glass crucible over a waiting period after polycrystalline silicon is charged into the silica glass crucible until melting of the polycrystalline silicon in the production of single crystalline silicon.

According to the invention, the intrusion of raw material powder for a silica glass crucible into the inner face of the crucible and hence the intrusion of foreign matters into the silica glass crucible are avoided surely, so that it is possible to handle the silica glass crucible at such a state that the inner face is not contaminated over a period from the delivery of the crucible to the melting step of polycrystalline silicon.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIGS. 1A and 1B are radially cross-sectional views of a crucible showing a closure for crucible according to the invention;

FIGS. 3A and 3B are radially cross-sectional views of a crucible showing another closure for crucible according to the invention;

FIGS. 5A, 5B, 5C, 5D and 5E are a process chart showing the handling of a crucible according to the invention.

DETAILED DESCRIPTION

Figure 2A:
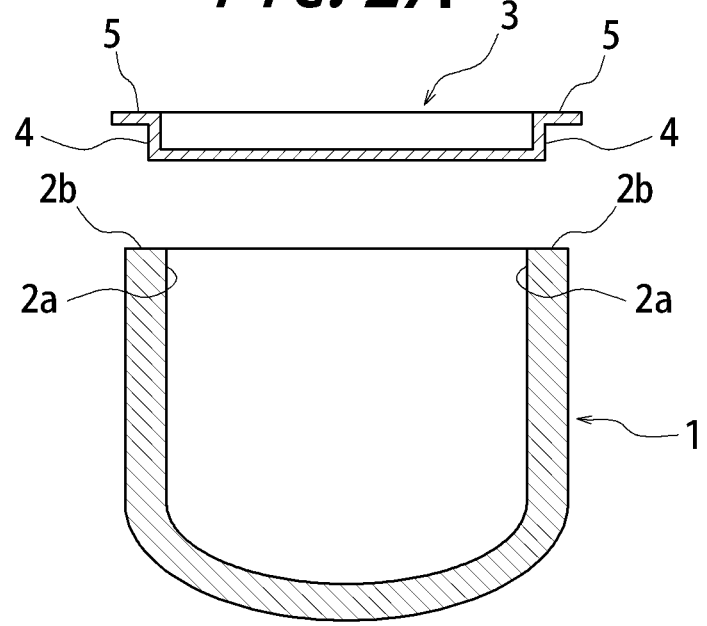
FIGS. 2A and 2B are radially cross-sectional views of a crucible showing another closure for crucible according to the invention.

While illustrative embodiments have been illustrated and described, it will be appreciated that various changes can be made therein without departing from the spirit and scope of the invention.

A silica glass crucible mounted with a closure according to the invention will be described in detail with reference to the drawings below. In FIG. 1A is shown a radial cross section of a crucible before the mounting of a closure according to the invention, and FIG. 1B shows a radially cross section of the crucible after the mounting of the closure.

In FIGS. 1A and 1B, numeral 1 is a crucible of silica glass (hereinafter merely referred to as crucible), and a closure 3 is mounted on an opening portion 2 of the crucible 1. The closure 3 is disc-shaped similar to the opening portion 2 and is provided with a peripheral edge mounting portion 4 closely adhered to an inner peripheral end 2a of the opening portion in the crucible 1. As shown in FIG. 1B, the closure 3 is mounted on the opening portion 2 of the crucible 1 by closely adhering the peripheral edge mounting portion 4 to the inner peripheral end 2a. It is preferable that a diameter of the peripheral edge mounting portion 4 is equal to or slightly larger than an inner diameter of the crucible 1 for sealing the opening portion 2 with no space.

Further, the closure 3 is preferable to be made from a flexible material such as an ABS resin, a urethane resin, polyethylene, polypropylene, vinyl chloride, an acrylic resin, a polycarbonate or the like, whereby the attaching and detaching of the closure can be conducted surely because it is possible to push the peripheral edge mounting portion 4 to the inner peripheral end 2a during the mounting by utilizing the restoring force of the closure after the deflection in a radial direction as shown in FIG. 1B.

When the closure 3 with such a constitution is mounted on the opening portion 2 of the crucible 1, the opening portion 2 is surely sealed and a portion in contact with the closure is limited to the inner peripheral face of the crucible 1, so that there is obviated such a situation that the raw material powder and the like attached to the outer peripheral face of the crucible 1 are introduced into the inside of the crucible, for example, by wrapping, and hence the intrusion of foreign matters into the crucible can be unfailingly avoided.

Figure 2B:
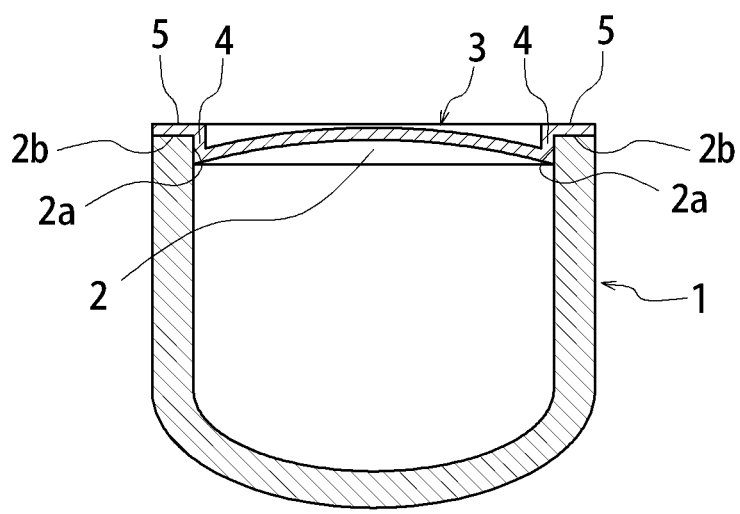

As shown in FIGS. 2A-2B, a flange portion 5 can be further provided so as to extend outward from the peripheral edge mounting portion 4 in a radial direction. The flange portion 5 is firmly attached to an upper peripheral end face 2b of the opening portion 2 so as to fix the closure 3. Even in this case, it is preferable that the attaching and detaching of the closure can be conducted surely because it is possible to push the peripheral edge mounting portion 4 to the inner peripheral end 2a during the mounting by utilizing the restoring force of the closure after the deflection in a radial direction as shown in FIG. 2B likewise the case shown in FIG. 1B.

The closure structure shown in FIGS. 2A-2B is especially effective for avoiding the incorporation of impurities at the pulling step in the production of single crystalline silicon because the contamination on the upper peripheral end face 2b of the opening portion 2 can be avoided by covering the upper peripheral end face 2b with the flange portion 5. Here, the diameter of the flange portion 5 is preferable to be equal to or more than the outer diameter of the crucible 1 for completely covering the upper peripheral end face 2b to avoid the contamination.

Furthermore, the closure 3 can be made thicker than those of FIGS. 1A and 2A as shown in FIGS. 3A-3B. Such a closure is effective for preventing penetration of "moisture", which penetrates, for example, from the outside of the closure there into. Since metal elements deteriorating crucible performance may be absorbed in the moisture contained in ambient air, it is preferable to reduce the amount of the moisture to be penetrated for maintaining the crucible performance.

Figure 4:
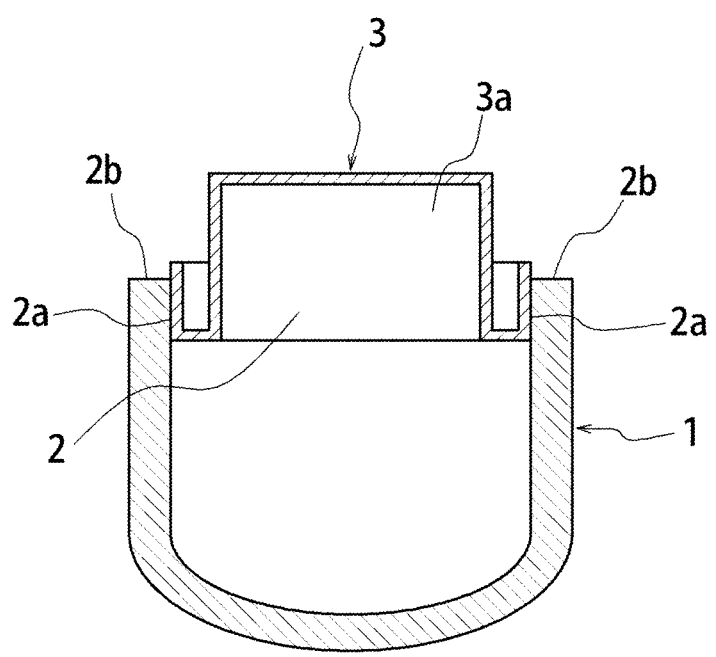
FIG. 4 is a radially cross-sectional view of a crucible showing another closure for crucible.

As the structure of the closure 3, it is not limited to examples shown in FIGS. 1A-3B and a closure shown in FIG. 4 may be applied. Since the closure 3 assures a large space 3a in its inner face, it advantageously serves as a closure when polycrystalline silicon is charged at a heaped state in the production of single crystalline silicon as mentioned later.

Moreover, it is preferable to provide an identifier such as a barcode, a QR code or the like to the closure 3. Since it is difficult to dig a barcode on glass materials, a separate barcode travels side by side for lot identification. However, it becomes possible to move the crucible alone by providing a barcode to a closure. Incidentally, when a barcode seal is attached to the conventional wrapping sheet, it is possible to move the crucible alone, but it is disadvantageous that since polycrystalline silicon is included in the crucible, once the wrapping sheet is removed, it can not be reused.

When the crucible 1 is used by removing the closure 3 mounted on the opening portion of the crucible 1, or when the closure 3 is removed, for example, for supplying polycrystalline silicon to the crucible 1, it is preferable to remove the closure 3 after the crucible 1 is inverted to direct the opening portion downward in a vertical direction. Thus, by turning the opening portion of the crucible 1 downward in the removal of the closure 3 can be avoided the intrusion of foreign matters such as raw material powder, dust and the like attached to the surface of the closure 3.

The closure can be used repeatedly by cleaning. The current wrapping sheet is usually disposed after use since it is difficult to be cleaned. On the other hand, the closure is cleanable, so that it can be provided again after enhancing its cleanliness. In this case, as the cleanliness of the closure is preferable an amount of metal components at least adhered to the inner face of the closure of not more than 0.05 ng/cm² for enhancing the cleanliness of the inner face of the crucible.

The cleanliness of the crucible can be measured by applying an aqueous solution of hydrogen chloride (HCl) to a face to be measured such as the inner face of the closure or the like and collecting the solution applied and analyzing by an inductively-coupled plasma mass spectrometry (ICP-MS). At this moment, metal elements to be measured are Na, K, Li, Al, Ca, Co, Cr, Cu, Fe, Mg, Mn, Ni, Ti, Zn, Zr, Ba, P and so on.

By using the closure 3 as mentioned above, it is made possible to handle a crucible as described below.

In the production of single crystalline silicon as shown in FIGS. 5A-5E, the closure 3 of the crucible 1 after the delivery as shown in FIG. 5A is first removed as shown in FIG. 5B, and thereafter polycrystalline silicon 6 is charged into the crucible 1 as shown in FIG. 5C, and immediately the closure 3 is mounted on the opening portion 2 of the crucible 1 as shown in FIG. 5D to subsequently shut off the inside of the crucible 1 from ambient air. By storing the crucible at a state shown in FIG. 5E can be kept the raw material silicon in the crucible 1 at a non-contaminated state over a waiting period until the melting of polycrystalline silicon.

Moreover, it is preferable that at least a part of the closure 3 is made transparent as an observation window for visibly observing the raw material silicon charged in the crucible 1 at a state mounted with the closure 3. As a matter of course, the whole of the closure 3 may be made from a transparent material. Thus, if the inside of the crucible 1 can be visualized easily, it is easy and convenient to distinguish between a crucible charged with the raw material silicon and an empty crucible. As the transparent material are preferable polyethylene (PE), polypropylene (PP) and the like.

EXAMPLE 1

There are examined the number of silica powder intruded into an inner face of a crucible and the yield of crystal when a closure as shown in FIGS. 1A-1B and 2A-2B is mounted onto an opening portion of the crucible. For the comparison, the same examination is conducted for the case that a crucible is covered with a wrapping sheet and for the case that the opening portion of a crucible is free. The examination results are shown in Table 1.

Here, the number of silica powder intruded into the inner face of the crucible is obtained by visually observing the number of silica powder and silica pieces adhered to the inner face of the crucible after the crucible is conveyed to a pulling step in the production of single crystalline silicon and the closure is removed therefrom before filling polycrystalline silicon. Moreover, the unit in the number of silica powder is "powders". The yield of crystal shows a ratio of weight of crystal obtained as a single crystal to weight of raw material.

TABLE 1

|  | Closure (a) (FIG. 1B) | Closure (b) (FIG. 2B) | Conventional wrapping sheet | No wrapping or closure |
|---|---|---|---|---|
| Number of silica powder intruded into inner face of crucible * | 3 | 1 | 10 | 100 |
| Yield of crystal %) | 82 | 83 | 80 | 70 |

* Measuring condition: measured after conveyance to a pulling step for the production of single crystalline silicon The embodiments of the invention in which an exclusive property or privilege is claimed are defined as follows:

1. A method of handling a silica glass crucible during the production of single crystalline silicon, comprising mounting a closure onto an opening portion of a silica glass crucible over a waiting period after polycrystalline silicon is charged into the silica glass crucible until melting of the polycrystalline silicon;

wherein the closure is a closure for the silica glass crucible sized and configured to be sealably mounted on the opening portion of the silica glass crucible, the closure comprising a peripheral edge mounting portion sized to closely adhere to an inner peripheral end of the opening portion;

wherein the closure is made from a flexible material so that the closure is mountable to the silica glass crucible by a restoring force of the closure after deflection in a radial direction thereof.

2. The method of claim 1, wherein an amount of metal components at least adhered to an inner face of the closure is not more than 0.05 ng/cm².

3. The method of claim 1, wherein the closure further comprises a flange portion extending outward from the peripheral edge mounting portion in a radial direction.

4. The method of claim 1, wherein the closure comprises an identifier.

5. The method of claim 1, wherein at least a part of the closure is transparent.

* * * * *